(12) United States Patent
Otani et al.

(10) Patent No.: US 11,387,211 B2
(45) Date of Patent: Jul. 12, 2022

(54) BONDING APPARATUS AND BONDING METHOD

(71) Applicant: SHINKAWA LTD., Tokyo (JP)

(72) Inventors: Tetsuya Otani, Tokyo (JP); Osamu Watanabe, Tokyo (JP); Tomonori Nakamura, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 253 days.

(21) Appl. No.: 16/624,303

(22) PCT Filed: May 18, 2018

(86) PCT No.: PCT/JP2018/019332
§ 371 (c)(1),
(2) Date: Apr. 13, 2020

(87) PCT Pub. No.: WO2018/212336
PCT Pub. Date: Nov. 22, 2018

(65) Prior Publication Data
US 2020/0243476 A1      Jul. 30, 2020

(30) Foreign Application Priority Data

May 19, 2017    (JP) .............................. JP2017-099890

(51) Int. Cl.
*H01L 23/00*      (2006.01)
*B23K 20/02*      (2006.01)
*B23K 101/40*     (2006.01)

(52) U.S. Cl.
CPC ............ *H01L 24/75* (2013.01); *B23K 20/023* (2013.01); *H01L 24/81* (2013.01);
(Continued)

(58) Field of Classification Search
None
See application file for complete search history.

(56) References Cited

U.S. PATENT DOCUMENTS 8,242,015 B2 *  8/2012  Matsumoto ....... H01L 21/28562
                                                    438/627

FOREIGN PATENT DOCUMENTS

JP        2012174861        9/2012
JP        2015053441        3/2015
(Continued)

OTHER PUBLICATIONS

"International Search Report (Form PCT/ISA/210)"of PCT/JP2018/019332, dated Jul. 3, 2018, with English translation thereof, pp. 1-2.
(Continued)

*Primary Examiner* — Long Pham
(74) *Attorney, Agent, or Firm* — JCIPRNET

(57) ABSTRACT

A bonding apparatus bonds a semiconductor die, which has a first mam surface provided with a bump electrode, to a substrate by means of thermo-compression, with a thermo-compression film being interposed therebetween. The bonding apparatus includes: an intermediate stage that has a die placing surface on which the semiconductor die is placed such that the die placing surface faces the first main surface; and a bonding tool which detachably holds a second main surface of the semiconductor die that is placed on the intermediate stage, the second main surface being on the reverse side of the first main surface. The intermediate stage has a push-up mechanism which applies, to the first main surface of the semiconductor die, a force for separating the semiconductor die therefrom in the normal direction of the die placing surface (in a Z-axis direction).

4 Claims, 9 Drawing Sheets

(52) U.S. Cl.
CPC .... *B23K 2101/40* (2018.08); *H01L 2224/75301* (2013.01); *H01L 2224/75745* (2013.01); *H01L 2224/81203* (2013.01)

(56) References Cited

FOREIGN PATENT DOCUMENTS

| | | |
|---|---|---|
| TW | 200915400 | 4/2009 |
| TW | 201223771 | 6/2012 |

OTHER PUBLICATIONS

"International Preliminary Report on Patentability (Form PCT/IPEA/409) of PCT/JP2018/019332", dated May 28, 2019, with English translation thereof, pp. 1-12.

"Office Action of Taiwan Counterpart Application" with English translation thereof, dated Jun. 9, 2021, p. 1-p. 11.

"Office Action of Taiwan Counterpart Application", dated Apr. 13, 2020, with English translation thereof, pp. 1-9.

\* cited by examiner (a)

(b)

(a)

(b)

BONDING APPARATUS AND BONDING METHOD

CROSS-REFERENCE TO RELATED APPLICATION

This application is a 371 of international application of PCT application serial no. PCT/JP2018/019332, filed on May 18, 2018, which claims the priority benefit of Japan application no. 2017-099890, filed on May 19, 2017. The entirety of each of the above-mentioned patent applications is hereby incorporated by reference herein and made a part of this specification.

BACKGROUND OF THE INVENTION

Technical Field

An aspect of the present invention relates to a bonding apparatus and a bonding method.

Related Art

A technology for bonding an electronic component such as a semiconductor die to a substrate is known. When the electronic component is bonded to the substrate, the electronic component placed on a stage is first held by a tool. Thereafter, the electronic component is moved above the substrate on which an adhesive is applied. Then, the tool heats the adhesive via the electronic component, while pressing the electronic component against the substrate. The electronic component is mechanically and electrically connected to the substrate by the pressing and heating.

LITERATURE OF RELATED ART

Patent Literature

Patent literature 1: Japanese Patent Laid-Open No. 2012-174861

SUMMARY

Problems to be Solved

In a bonding operation, the tool repeats a step of holding the electronic component and a step of pressing and heating. As a result, the step of holding the electronic component is performed by a hot tool in some cases. On the other hand, the electronic component is placed on a flexible film in the stage. When the hot tool comes into contact with the electronic component placed on the stage, heat of the tool is transferred to the film via the electronic component. Since the film is easily influenced by the heat, the hot tool influences delivery of the electronic component from the stage to the tool. Specifically, the film melts due to the heat of the tool. As a result, the film sticks to the stage and thus influences the delivery of the electronic component.

For example, Patent Literature 1 discloses a technology for suitably delivering a semiconductor chip. In the technology, a suction part which is a tool approaches the semiconductor chip. At this time, the suction part does not come into contact with the semiconductor chip. Besides, air sucking is performed from a suction hole provided in the suction part, and thereby the semiconductor chip is suctioned up.

However, when the semiconductor chip is sucked up by the suction part, rotation and a positional displacement of the semiconductor chip occurs during suctioning up. The rotation and the positional displacement of the semiconductor chip can be suppressed by, for example, performing suctioning in a state that the tool is close to a semiconductor chip. However, closeness of the tool to the semiconductor chip causes the heat of the tool to be transferred to the semiconductor chip, the film, and the delivery unit. As a result, the film sticks to the delivery unit. On the other hand, when a distance between the tool and the semiconductor chip is increased in order to suppress sticking of the film to the delivery unit, the rotation and the positional displacement of the semiconductor chip increases. Hence, it is not possible to deliver the semiconductor chip with high precision.

The present invention is made with consideration for such circumstances, and an object thereof is to provide a bonding apparatus and a bonding method by which an electronic component can be delivered with high precision and an influence of heat of a tool can be reduced.

Means to Solve Problems

According to an aspect of the present invention, there is provided a bonding apparatus that bonds an electronic component, which has an electrode surface provided with a plurality of electrode portions, to a substrate or another electronic component by means of thermo-compression, with a thermo-compression film being interposed therebetween. The bonding apparatus includes: a stage that has a placing surface on which the electronic component is placed such that the placing surface faces the electrode surface; and a bonding tool which detachably holds a main surface of the electronic component that is placed on the stage, the main surface being on a reverse side of the electrode surface. The stage has a push-up unit which applies, to the electrode surface of the electronic component, a force for separating the electronic component therefrom in a normal direction of the placing surface.

In the bonding apparatus, when the electronic component placed on the stage is delivered to the bonding tool, the push-up unit pushes up the electronic component from the stage. The push-up unit applies, to the electronic component, the force for moving the electronic component toward the bonding tool. Movement of the electronic component based on the force enables the electronic component to be moved toward the bonding tool, while a posture of the electronic component is maintained. Hence, since rotation and a positional displacement of the electronic component are suppressed, the electronic component can be delivered with high precision. Further, at a timing when the electronic component is separated from the stage, a gap is formed between the bonding tool and the electronic component. The gap functions as thermal resistance to heat transfer from the bonding tool to the electronic component. Hence, an influence of heat of the bonding tool on the electronic component can be reduced.

Effect

According to the bonding apparatus of an aspect of the present invention, a semiconductor chip can be delivered with high precision, and an influence of heat from a tool can be reduced.

DESCRIPTION OF THE EMBODIMENTS

Hereinafter, embodiments of the present invention will be described in detail with reference to the accompanying drawings. The same reference signs are assigned to the same elements in description of the drawings, and repeated description thereof is omitted.

First Embodiment

Figure 1:
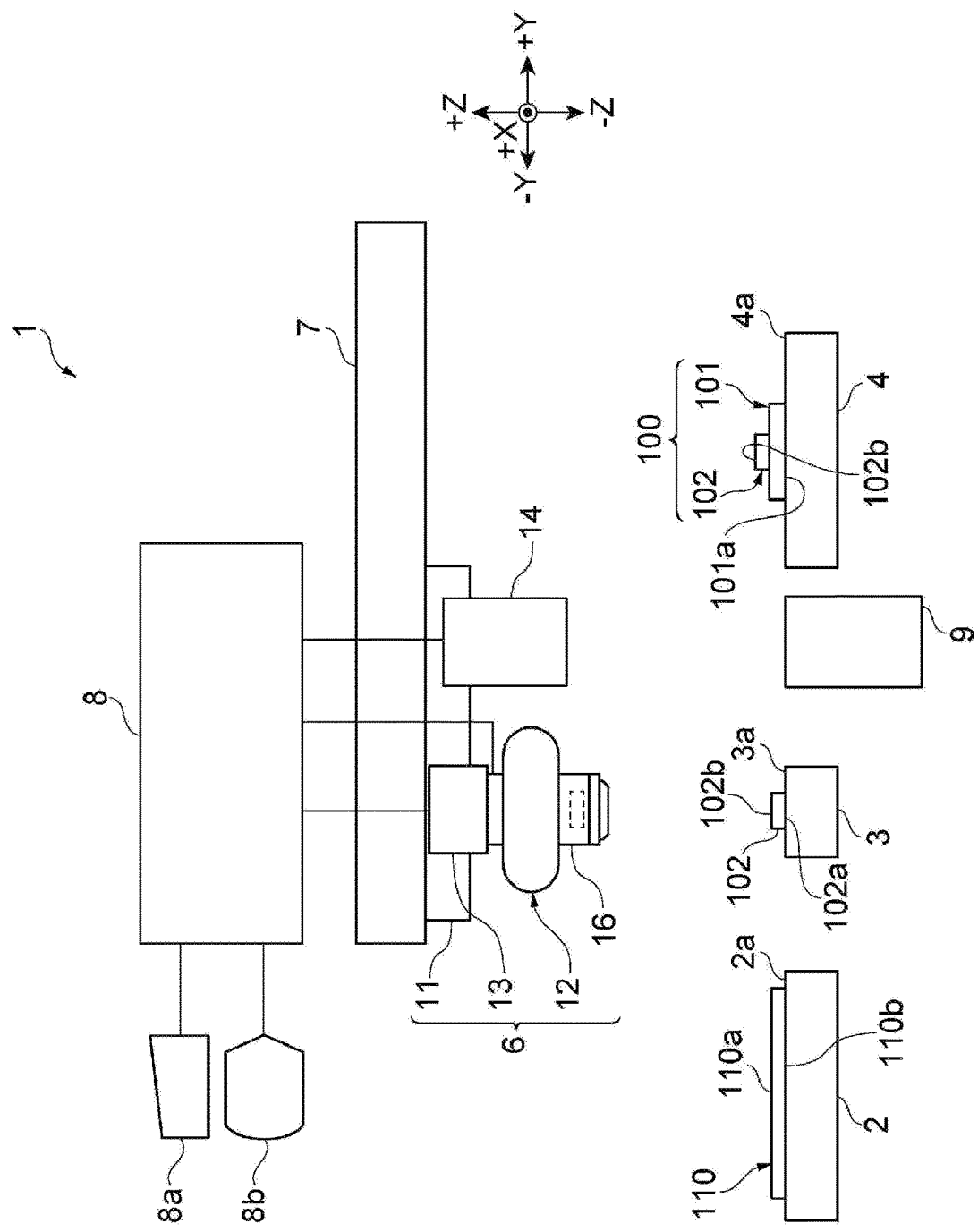
FIG. 1 is a diagram schematically illustrating a configuration of a bonding apparatus according to a first embodiment.

As illustrated in FIG. 1, a bonding apparatus 1 mounts a semiconductor die 102 as an example of an electronic component in a bonding region of a substrate 101. Through the mounting, a semiconductor device 100 including the substrate 101 and the semiconductor die 102 is obtained. In the following description, an X axis and a Y axis which are orthogonal to each other are parallel to a main surface of the semiconductor die 102 (or any main surface of a stage). A Z axis is perpendicular to both the X axis and the Y axis.

Figure 2:
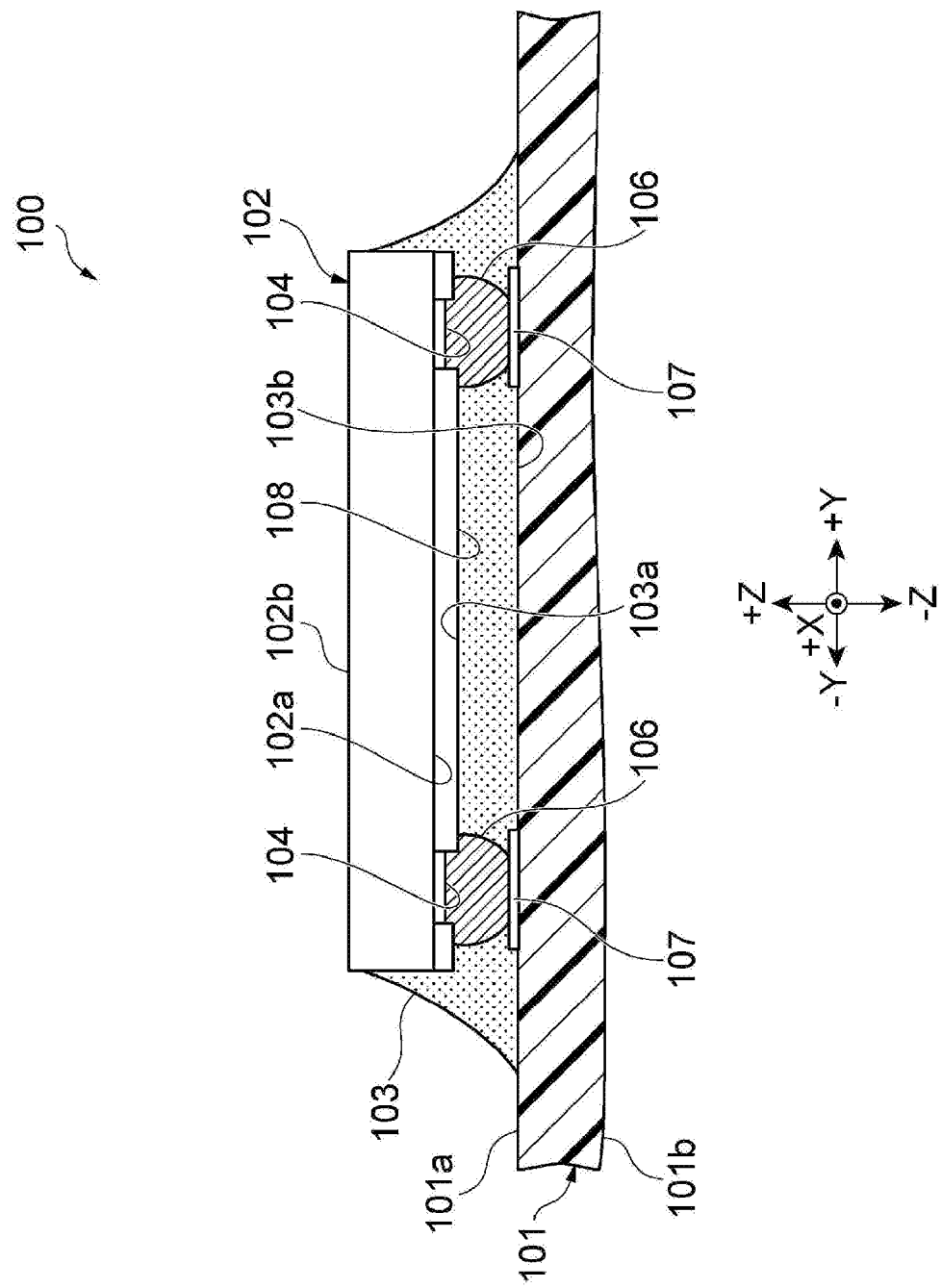
FIG. 2 is a cross-sectional view of a semiconductor device which is assembled by the bonding apparatus in FIG. 1.

The semiconductor device 100 which is assembled by the bonding apparatus 1 is described. As illustrated in FIG. 2, the semiconductor device 100 includes the substrate 101 and the semiconductor die 102.

The substrate 101 has a diced plate-like shape and has a first main surface 101a and a second main surface 101b. The first main surface 101a has at least one mounting region in which the semiconductor die 102 is mounted. Hence, the semiconductor die 102 is bonded to the first main surface 101a of the substrate 101. The second main surface 101b is a back surface of the first main surface 101a. Examples of a material of the substrate 101 includes an organic material (for example, an epoxy substrate or a polyimide substrate), an inorganic material (for example, a glass substrate), or a composite material thereof (for example, a glass epoxy substrate). The substrate 101 is a so-called interposer.

Moreover, a plurality of mounting regions may be arranged in one substrate. In this case, the semiconductor die 102 is bonded to each mounting region of the substrate. Then, the substrate is diced for each mounting region, and thereby a plurality of semiconductor devices 100 is obtained. In addition, the semiconductor device 100 may have a stack structure in which a plurality of semiconductor dies 102 is stacked. In a stacked semiconductor device, all of two or more semiconductor dies 102 may be oriented in the same direction. In addition, in the stacked semiconductor device, the two or more semiconductor dies 102 may oriented in different directions from each other. In addition, in the semiconductor device 100, two or more semiconductor dies 102 may be bonded in one mounting region.

The semiconductor die 102 is fixed to the substrate 101 by using a thermo-compression film 103. The thermo-compression film 103 has a die adhering surface 103a which is adhered to the semiconductor die 102 and a substrate adhering surface 103b which comes into contact with the substrate 101. The thermo-compression film 103 is made of, for example, a thermosetting resin and is an insulation film (NCF: non-conductive film) by which a plurality of bump electrodes 106 of the semiconductor die 102 is insulated from each other.

The semiconductor die 102 has a diced plate-like shape smaller than that of the substrate 101 in a plan view. The semiconductor die 102 has a first main surface 102a (electrode surface) and a second main surface 102b (main surface). A predetermined circuit pattern is arranged on the first main surface 102a. Further, a plurality of electrode pads 104, the plurality of bump electrodes 106 (plurality of electrode portions), and a protective film 108 are arranged on the first main surface 102a. Besides, the first main surface 102a faces the first main surface 101a of the substrate 101. Such a bonding state is face-down bonding. The second main surface 102b is a back surface opposite of the first main surface 102a. The semiconductor die 102 is configured of a semiconductor material such as silicon.

The electrode pad 104 is electrically connected to an electrode pad 107 formed on the first main surface 101a of the substrate 101. The bump electrode 106 is arranged on the electrode pad 104. The protective film 108 is arranged around the plurality of bump electrodes 106. In other words, an outer circumferential end portion of the electrode pad 104 is covered with the protective film 108. On the other hand, a central portion of the electrode pad 104 is exposed from the protective film 108. This exposed part is a portion electrically connected to the bump electrodes 106. An example of a material of the electrode pad 104 and the bump electrode 106 includes a material having conductivity. For example, the electrode pad 104 may be configured of aluminum, copper, or the like. In addition, the bump electrode 106 may be configured of gold or the like.

Next, the bonding apparatus 1 will be described. As illustrated in FIG. 1, the bonding apparatus 1 includes a wafer stage 2, an intermediate stage 3, a bonding stage 4, a bonding unit 6, an XY stage 7, a bonding controller (hereinafter, simply referred to as a "controller 8"), and an imaging unit 9.

A wafer 110 is temporarily placed on the wafer stage 2. The wafer 110 is fixed to a mounting surface 2a of the wafer stage 2. The wafer 110 includes the plurality of diced semiconductor dies 102. The wafer 110 has a first main surface 110a and a second main surface 110b. The first main surface 110a has a predetermined circuit pattern. The first main surface 110a is the first main surface 102a of the semiconductor die 102. The second main surface 110b is a back surface opposite of the first main surface 110a. The second main surface 110b is the second main surface 102b of the semiconductor die 102.

The semiconductor die 102 is temporarily placed on the intermediate stage 3, with the thermo-compression film 103 (refer to FIG. 2) stuck to the semiconductor die. The intermediate stage 3 is disposed between the wafer stage 2 and the bonding stage 4. The intermediate stage 3 may be a part of a rotary head collet which is configured to be movable in an X-axis direction and a Y-axis direction by a drive mechanism such as a linear motor not illustrated.

Figure 3:
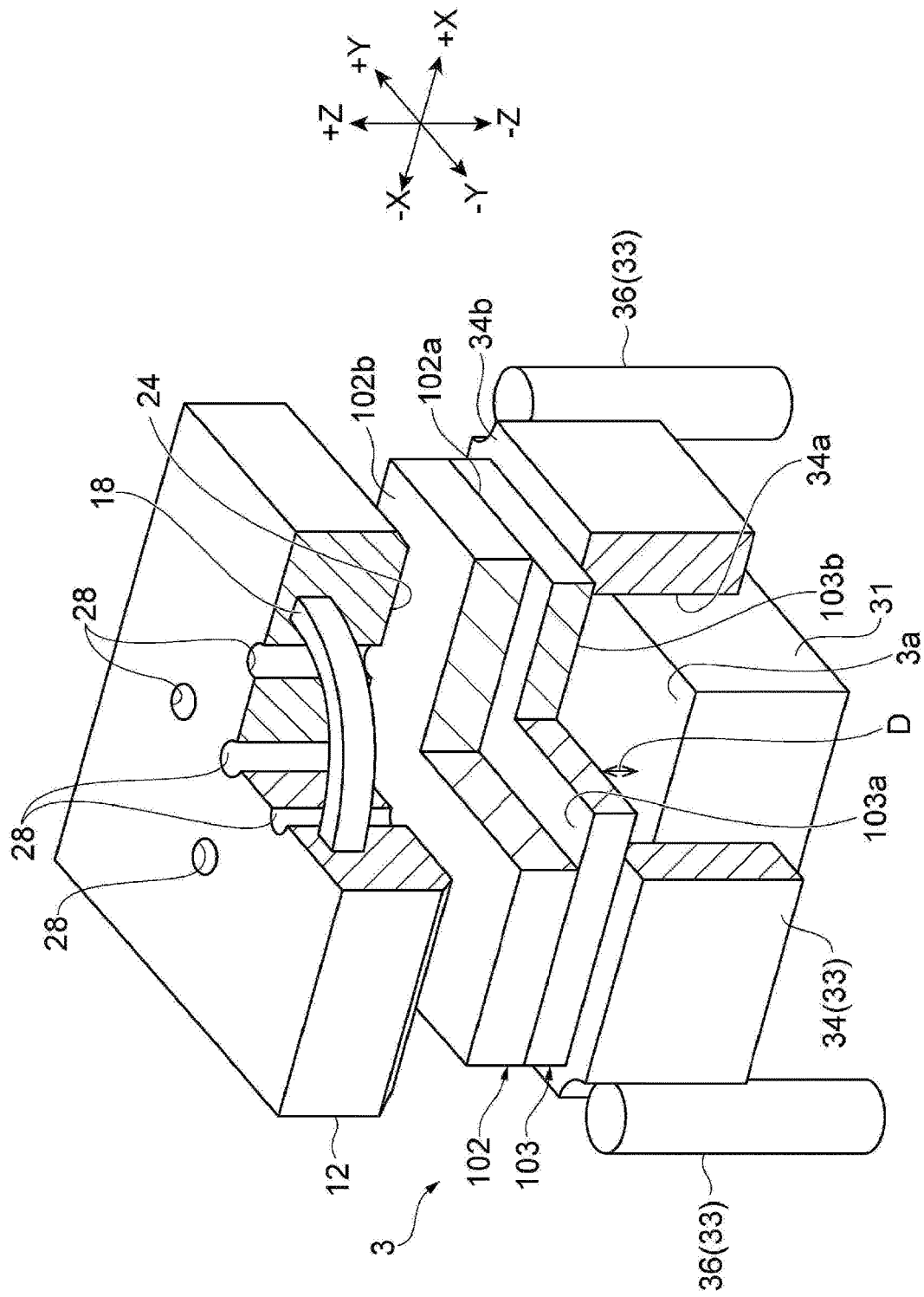
FIG. 3 is a perspective view illustrating a bonding tool and an intermediate stage illustrated in FIG. 1.
Figure 4:
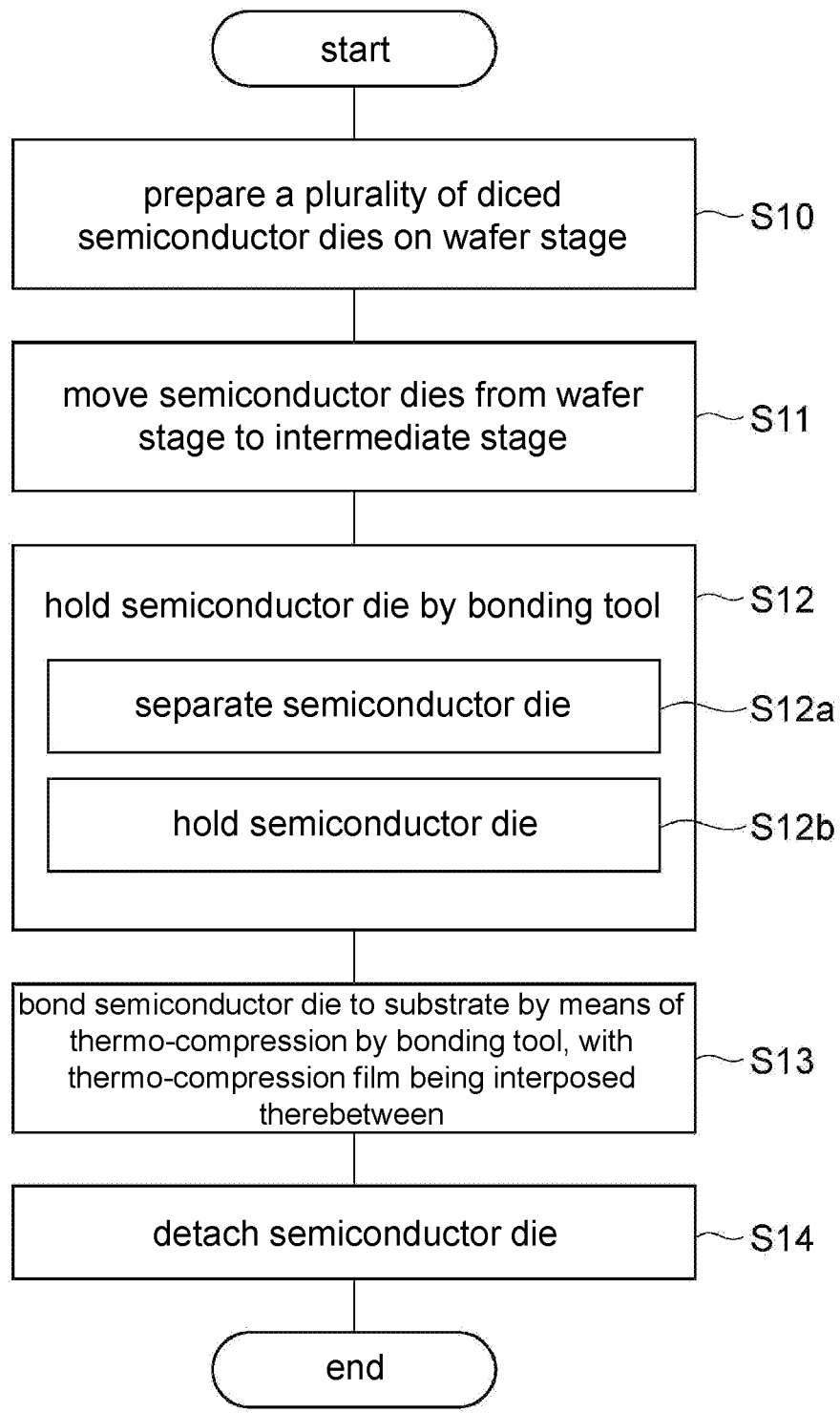
FIG. 4 is a flowchart illustrating principal steps of a bonding method using the bonding apparatus illustrated in FIG. 1.

The intermediate stage 3 is described in more detail. As illustrated in FIG. 3, the intermediate stage 3 includes a base 31 and a push-up mechanism 33. The base 31 is a base body of the intermediate stage 3. A main surface of the base 31 is a die placing surface 3a of the intermediate stage 3. The die placing surface 3a faces the substrate adhering surface 103b of the thermo-compression film 103.

The push-up mechanism 33 pushes up the semiconductor die 102 in a normal direction (positive Z-axis direction). In other words, as illustrated in FIG. 3, the push-up mechanism 33 forms a gap D between the substrate adhering surface 103b of the thermo-compression film 103 and the die placing surface 3a of the base 31. The push-up mechanism 33 includes a push-up frame 34 (press-up member) and a drive unit 36. The push-up frame 34 has a rectangular parallelepiped shape provided with a through-hole. The push-up frame 34 includes a base disposing portion 34a, which is a through-hole in which the base 31 is disposed, and a contact surface 34b (contact portion) which is brought into contact with an outer circumferential edge of the thermo-compression film 103. The contact surface 34b faces the substrate adhering surface 103b of the thermo-compression film 103. In addition, the contact surface 34b is brought into contact with the outer circumferential edge portion of the substrate adhering surface 103b. In this manner, when the push-up frame 34 is configured to come into surface contact, a pressing force per unit area can be reduced. The drive unit 36 is coupled to the push-up frame 34. The drive unit 36 causes the push-up frame 34 to reciprocate in the normal direction (Z-axis direction). The drive unit 36 may be, for example, an air cylinder.

The push-up mechanism 33 switches between a state that the push-up frame 34 is located at a first position and a state that the push-up frame 34 is located at a second position. Such switching between the states is performed by an operation of the drive unit 36 based on a control signal which is supplied from the controller 8 (refer to FIG. 1).

The state that the contact surface 34b is located at the first position means a state that the contact surface 34b of the push-up frame 34 is positioned below the die placing surface 3a of the base 31 (refer to part (a) of FIG. 5) or a state that the contact surface 34b is flush with the die placing surface 3a of the base 31. In the state that the push-up frame 34 is located at the first position, the semiconductor die 102 is maintained to be placed on the die placing surface 3a.

Figure 5:
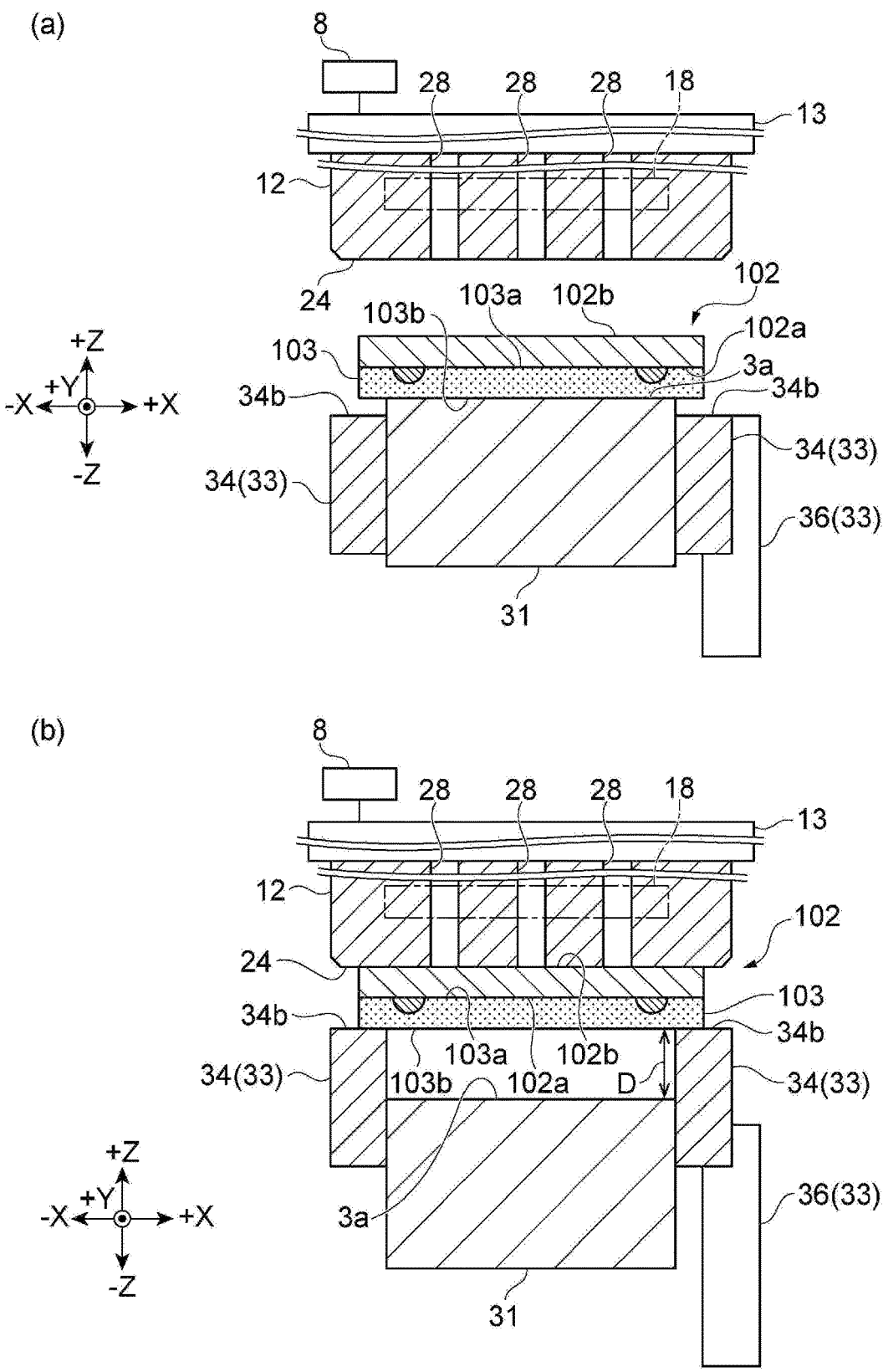
FIG. 5 is a diagram illustrating a step illustrated in FIG. 4.

The state that the contact surface 34b is located at the second position means a state that the contact surface 34b of the push-up frame 34 is positioned above the die placing surface 3a of the base 31 (refer to part (b) of FIG. 5). In this state, the contact surface 34b of the push-up frame 34 is in contact with the substrate adhering surface 103b of the thermo-compression film 103. That is, the gap D is formed between the substrate adhering surface 103b of the thermo-compression film 103 and the die placing surface 3a of the base 31. The gap D is set based on a distance between the intermediate stage 3 and a bonding tool 12. For example, the gap D between the substrate adhering surface 103b and the die placing surface 3a may be set such that the second main surface 102b of the semiconductor die 102 comes into contact with a bonding surface 24 of the bonding tool 12. For example, the gap D may be set within a range in which rotation and a positional displacement of the semiconductor die 102 does not occur, when the semiconductor die 102 is delivered from the intermediate stage 3 to the bonding tool 12. Moreover, non-occurrence of positional displacement here means that the rotation and the positional displacement of the semiconductor die 102 which occur when the semiconductor die 102 is delivered from the intermediate stage 3 to the bonding tool 12 is within an allowable range.

In a step of moving the semiconductor die 102 from the wafer stage 2 to the bonding stage 4, the semiconductor die 102 is first picked up from the wafer stage 2. Next, the semiconductor die 102 is turned upside down. That is, at first, the first main surface 102a is an upper side, and the second main surface 102b is a lower side. The turning upside down causes the second main surface 102b to become the upper side and the first main surface 102a to become the lower side. In this state, the semiconductor die 102 is placed on the intermediate stage 3. Hence, the first main surface 102a of the semiconductor die 102 placed on the intermediate stage 3 faces the die placing surface 3a of the intermediate stage 3.

As illustrated in FIG. 1, the substrate 101 during bonding is temporarily placed on the bonding stage 4. The substrate 101 is fixed to a mounting surface 4a of the bonding stage 4 by vacuum suction. At this time, the first main surface 101a of the substrate 101 faces the mounting surface 4a of the bonding stage 4. The bonding stage 4 is capable of moving the substrate 101 in the X-axis direction by a drive mechanism (not illustrated) including a guide rail. In addition, the bonding stage 4 includes a heater for heating the substrate 101.

The bonding unit 6 includes a bonding head 11, the bonding tool 12, a Z-axis drive mechanism 13, and an imaging unit 14. The bonding head 11 is attached to the XY stage 7. The bonding head 11 is movable in the X-axis direction and the Y-axis direction. The bonding tool 12 is attached to the bonding head 11 with the Z-axis drive mechanism 13 being interposed therebetween. In addition, the imaging unit 14 is also attached to the bonding head 11. That is, when the bonding head 11 is moved by the XY stage 7, the bonding tool 12 attached to the bonding head 11 moves in the same manner as the imaging unit 14.

The imaging unit 14 is separated from the bonding tool 12 by a predetermined distance in the Y-axis direction. The imaging unit 14 captures images of the second main surface 102b of the semiconductor die 102 placed on the intermediate stage 3. In addition, the imaging unit 14 captures images of the second main surface 102b of the semiconductor die 102 placed on the bonding stage 4. Moreover, the imaging unit 14 may not be fixed to the bonding head 11. The imaging unit 14 may be movable independently from the bonding tool 12.

The bonding tool 12 has a bonding distal end portion 16. The bonding distal end portion 16 detachably holds the semiconductor die 102. The bonding distal end portion 16 is an end portion of the bonding tool 12 on a side of the bonding stage 4, the bonding tool 12 being extended in the Z-axis direction. In addition, the bonding tool 12 has an air vacuuming function and/or air blowing function. The functions enable the bonding tool 12 to suction and/or detach the semiconductor die 102.

The controller 8 controls an operation of a configurational member of the bonding apparatus 1. Specifically, the controller 8 is connected to configurations of the bonding unit 6, the XY stage 7, the imaging units 9 and 14, and the like so as to being capable transmitting and receiving signals to and from the above configurations. This connection configuration enables the controller 8 to control operations of the configurational parts. For example, the controller 8 is a computer device including a CPU, a memory, and the like.

In the memory, a bonding program for executing a process required for bonding is stored in advance. The controller 8 is configured to be capable of executing steps related to a bonding method, which will be described below, of the semiconductor die according to the embodiment. An operation unit 8a for inputting control information and a display unit 8b for outputting the control information are connected to the controller 8.

The controller 8 performs positional control (XYZ axes) of the bonding unit 6, positional control (Z axis) of the bonding tool 12, positional control (θ) of the bonding tool 12 around the Z axis, tilt control (inclination with respect to the Z axis) of the bonding tool 12. Further, the controller 8 performs ON/OFF control of the air vacuuming function and/or air blowing function, load control when the semiconductor die 102 is mounted on the substrate 101, heat supply control of the bonding stage 4 and the bonding tool 12, operation control of the push-up mechanism 33 (refer to FIG. 3), and the like.

<Bonding Method>

Next, the bonding method using the bonding apparatus 1 will be described with reference to FIGS. 4, 5, 6, and 7. The bonding method according to the embodiment is performed using the bonding apparatus 1 illustrated in FIG. 1. The semiconductor device 100 (refer to FIG. 2) is manufactured by the bonding method of the embodiment.

First, a plurality of diced semiconductor dies 102 is prepared on the wafer stage 2 (S10). Specifically, on the wafer stage 2, the wafer 110 configured of a plurality of semiconductor dies 102 is prepared, with the thermo-compression film 103 stuck to the semiconductor dies. The wafer 110 is disposed on the wafer stage 2. At this time, the first main surface 102a of each of the plurality of semiconductor dies 102 is oriented upward, and the second main surface 102b faces the wafer stage 2.

Next, the semiconductor die 102 is moved from the wafer stage 2 to the intermediate stage 3 (S11). For example, cooperation of a suction tool and a pick-up unit (neither is illustrated) causes the plurality of semiconductor dies 102 on the wafer stage 2 to be moved one by one to the intermediate stage 3. Then, the controller 8 controls the XY stage 7 to move the bonding tool 12 above the intermediate stage 3.

Next, the bonding tool 12 holds the semiconductor die 102 placed on the intermediate stage 3 (S12). As illustrated in part (a) of FIG. 5, the controller 8 controls the Z-axis drive mechanism 13 to move the bonding tool 12 in a negative Z-axis direction. The controller 8 stops the moving when a gap between the bonding surface 24 and the second main surface 102b of the semiconductor die 102 approximates to a predetermined distance (for example, 1 mm). Next, as illustrated in part (b) of FIG. 5, the controller 8 controls the push-up mechanism 33 to push up the semiconductor die 102. This operation causes the semiconductor die 102 to be separated (S12a). The controller 8 stops the push-up operation when the second main surface 102b of the semiconductor die 102 comes into contact with the bonding surface 24. Then, the controller 8 controls a pneumatic system (not illustrated) to start sucking by using a suction hole 28 (Step S12b). This sucking causes the semiconductor die 102 to be held by the bonding tool 12. Then, the controller 8 controls the Z-axis drive mechanism 13 to move the bonding tool 12 in the positive Z-axis direction. In addition, as illustrated in part (a) of FIG. 6, the controller 8 controls the push-up mechanism 33 to move the push-up frame 34 in the negative Z-axis direction. That is, the contact surface 34b is separated from the substrate adhering surface 103b of the thermo-compression film 103.

Next, the bonding tool 12 bonds the semiconductor die 102 to the substrate 101 by means of thermo-compression via the thermo-compression film 103 (S13).

Figure 6:
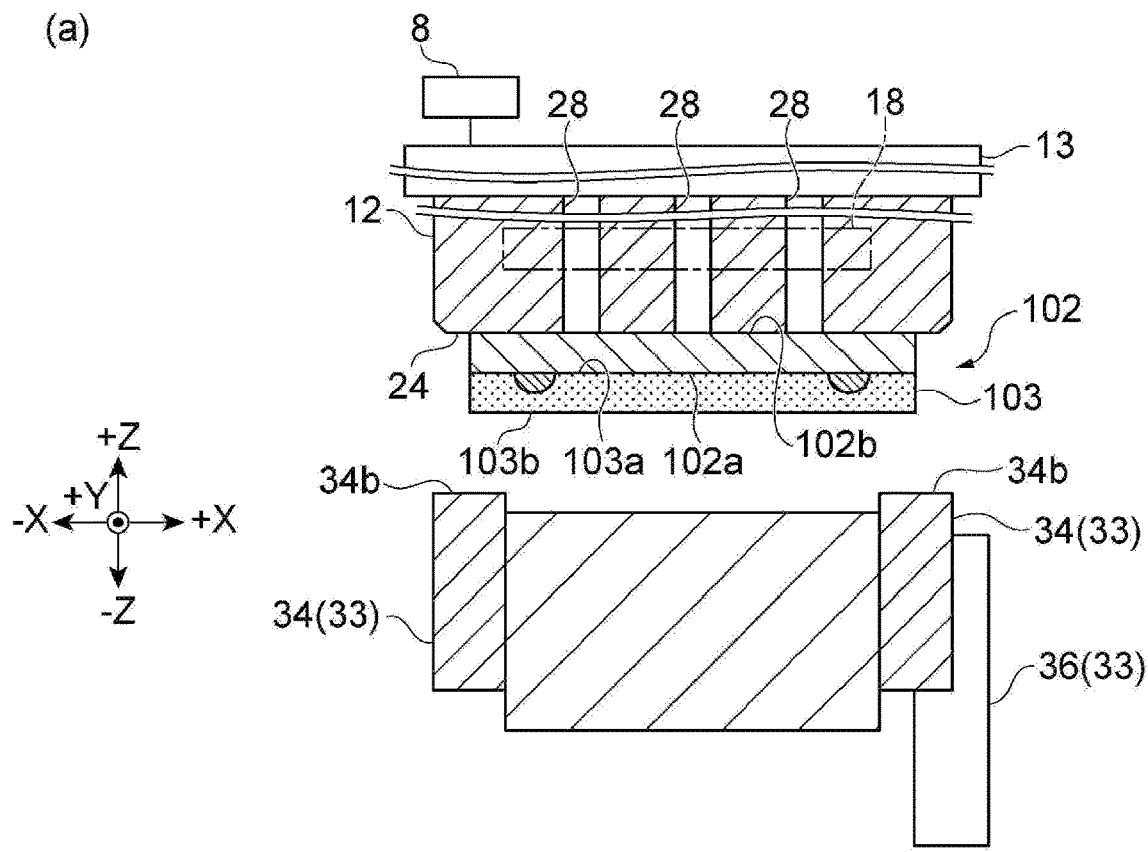
FIG. 6 is a diagram illustrating another step after the step illustrated in FIG. 5.
Figure 6:
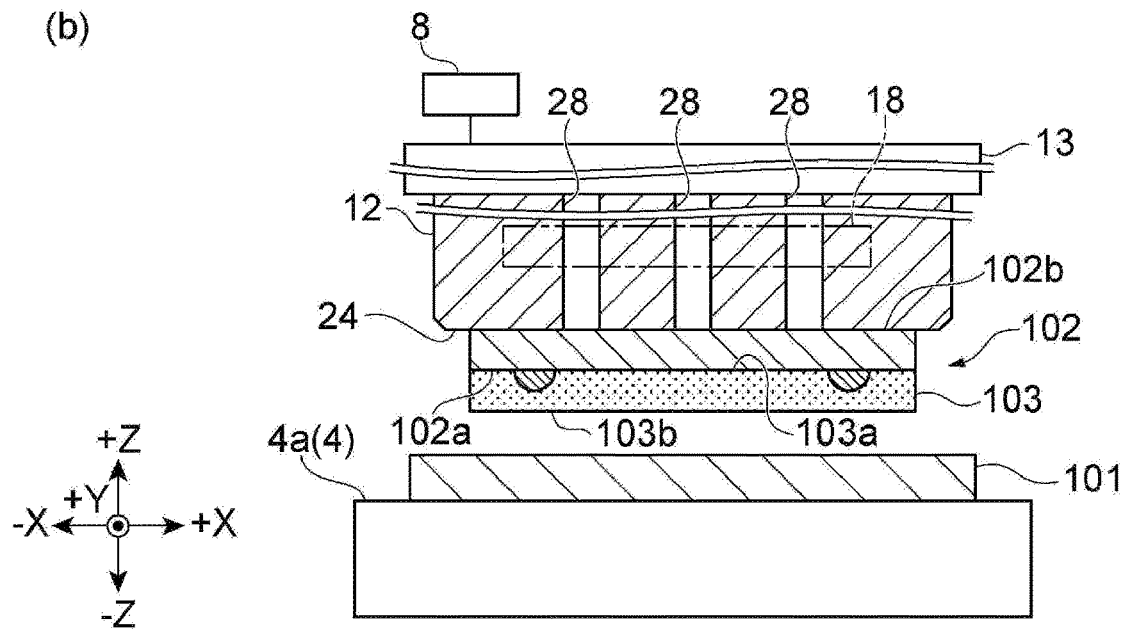

Specifically, as illustrated in part (b) of FIG. 6, the controller 8 controls the XY stage 7 (refer to FIG. 1) to move the bonding tool 12 suctioning the semiconductor die 102 to the bonding stage 4. The substrate 101 is disposed on the bonding stage 4.

Figure 7:
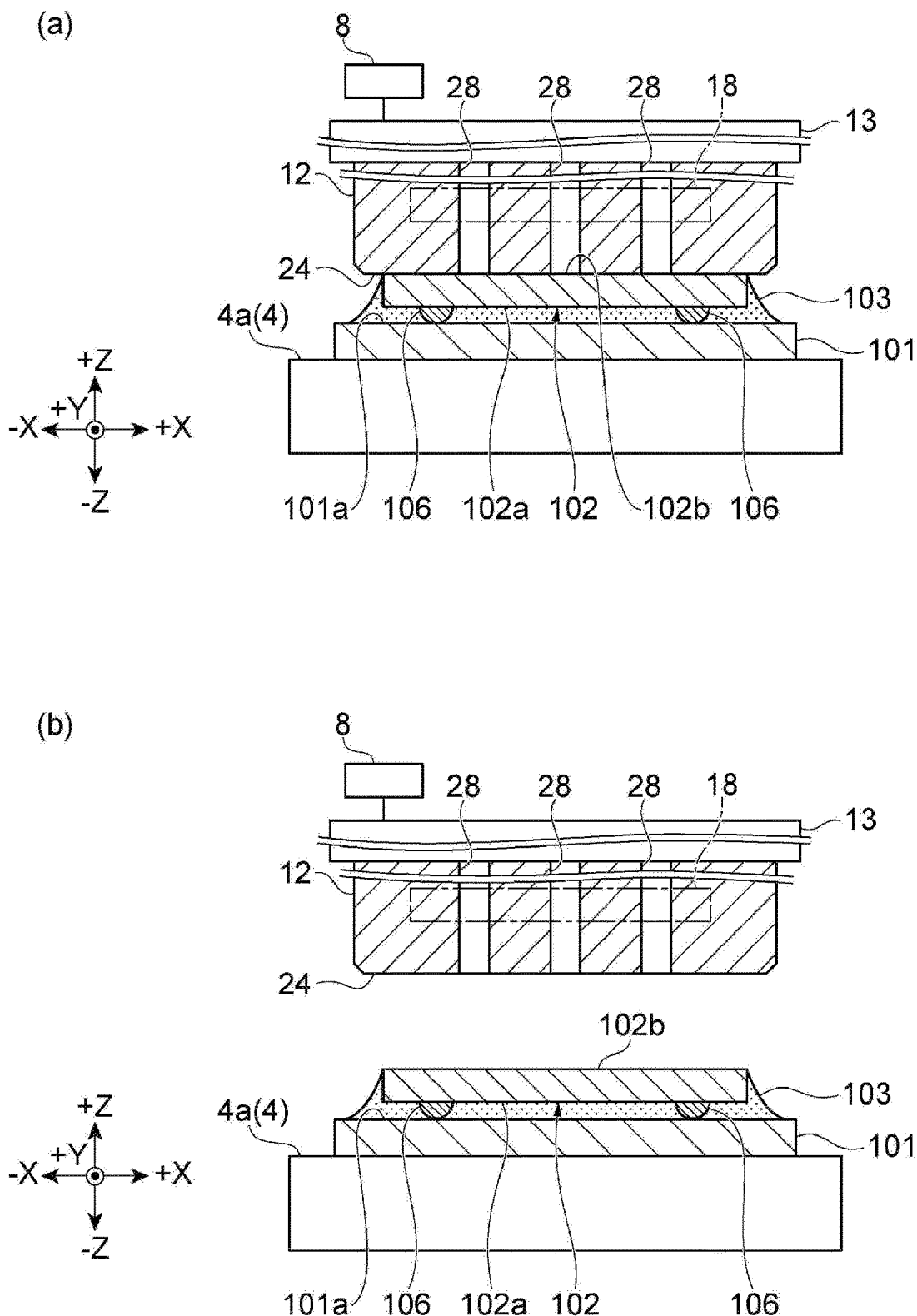
FIG. 7 is a diagram illustrating still another step after the step illustrated in FIG. 6.

As illustrated in part (a) of FIG. 7, the controller 8 transmits a control signal to the Z-axis drive mechanism 13, and thereby the bonding tool 12 is lowered toward the bonding stage 4. This lowering operation continues until the bump electrode 106 comes into contact with the first main surface 101a of the substrate 101. When the controller 8 detects contact of the bump electrode 106 with the substrate 101, the controller 8 switches the lowering operation of the bonding tool 12 to the load control such that a predetermined load is applied to the bump electrode 106 and the thermo-compression film 103. In addition, the controller 8 transmits a control signal to a heater 18, and thereby heating is started. This heating operation may be started while the lowering operation is performed or may be started after the lowering operation is ended. The lowering operation and the heating operation allow heat to be transferred to the thermo-compression film 103 via the semiconductor die 102. Due to the heat and the load, the thermo-compression film 103 is cured with heat such that the semiconductor die 102 is adhered to the substrate 101, and the bump electrode 106 is joined to an electrode of the substrate 101.

Consequently, electrical joining of the bump electrode 106 of the semiconductor die 102 to wiring (not illustrated) of the substrate 101 is achieved, and resin sealing can be performed between the semiconductor die 102 and the substrate 101.

When the bonding of semiconductor die 102 to the substrate 101 by means of thermo-compression is ended, the semiconductor die 102 is detached from the bonding surface 24, as illustrated in part (b) of FIG. 7 (S14). Specifically, at first, a suction operation of the suction hole 28 comes into an OFF state. Then, the controller 8 controls the Z-axis drive mechanism 13 to move the bonding tool 12 in the positive Z-axis direction. This operation enables the semiconductor die 102 to be detached from the bonding surface 24.

Hereinafter, operational effects of the bonding apparatus 1 and the bonding method according to the embodiment will be described.

In the bonding apparatus 1, when the semiconductor die 102 placed on the intermediate stage 3 is delivered to the bonding tool 12, the push-up mechanism 33 pushes up the semiconductor die 102 from the intermediate stage 3. The push-up mechanism 33 applies, to the semiconductor die 102, a force for moving the semiconductor die 102 toward the bonding tool 12. Movement of the semiconductor die 102 based on the force enables the semiconductor die 102 to be moved toward the bonding tool 12, while a posture of the semiconductor die 102 is maintained. Hence, since the rotation and the positional displacement of the semiconductor die 102 are suppressed, the semiconductor die 102 can be delivered with high precision. Further, at a timing when the semiconductor die 102 is separated from the intermediate stage 3, the gap D is formed between the bonding tool 12 and the semiconductor die 102. The gap D functions as thermal resistance to heat transfer from the bonding tool 12 to the semiconductor die 102. Hence, an influence of the heat of the bonding tool 12 on the semiconductor die 102 can be reduced.

In other words, in the bonding apparatus 1, when the semiconductor die 102 is held by the bonding tool 12, the heat of the bonding tool 12 is transferred to the thermo-compression film 103 via the semiconductor die 102. As a result, tackiness of the thermo-compression film 103 increases. However, at this time, the semiconductor die 102 is already separated from the intermediate stage 3. As a result, the semiconductor die 102 does not stick to the intermediate stage 3. Hence, even when the bonding tool 12 is hot, it is possible to perform work of holding the semiconductor die 102 on the intermediate stage 3 by the bonding tool 12. Consequently, since a time for cooling the bonding tool 12 is shortened, it is possible to shorten the time required for bonding work. Furthermore, according to the bonding apparatus 1 and the bonding method, productivity of the semiconductor device 100 can be improved.

Figure 8:
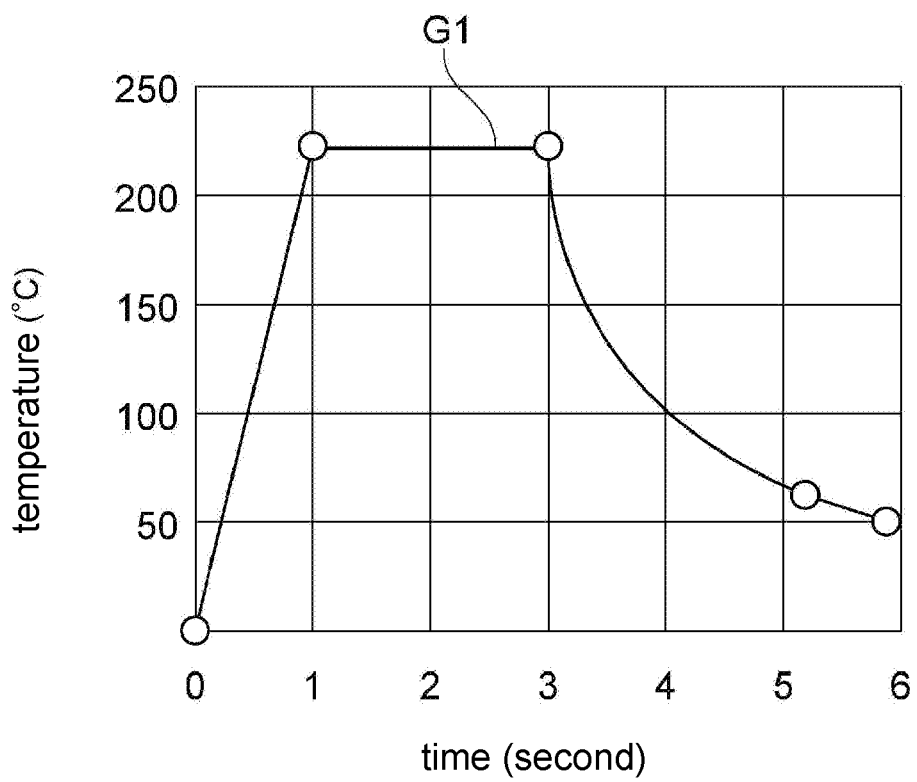
FIG. 8 is a graph for showing an operational effect of the bonding apparatus according to the first embodiment.
Figure 8:
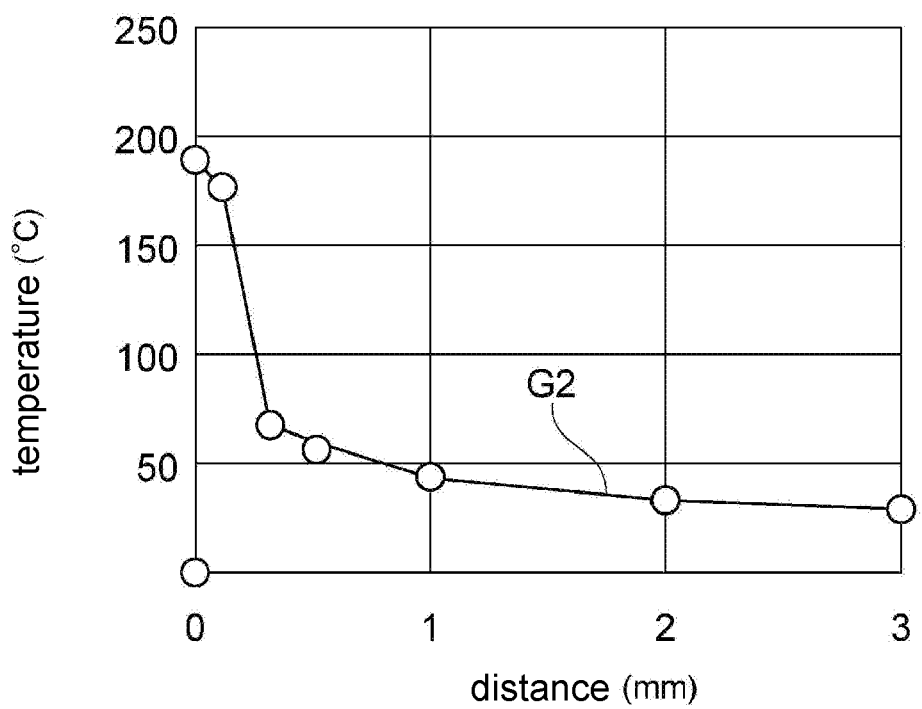

Part (a) of FIG. 8 illustrates a temperature history of the bonding surface 24. In a graph G1 in part (a) of FIG. 8, the horizontal axis represents an elapsed time, and the vertical axis represents a temperature of the bonding surface 24. Moreover, the temperature history illustrated in the graph G1 is an example. The operation of the bonding apparatus 1 according to the embodiment is not limited to the temperature history illustrated in the graph G1. The graph G1 represents a temperature history of the bonding surface 24 in a period including times before and after the step (S13) of bonding the semiconductor die 102 to the substrate 101. Specifically, at zero second, the bonding tool 12 holds the semiconductor die 102 (S12). Next, in a period from zero second to one second, the semiconductor die 102 is pressed against the substrate 101 and is heated (S13). Next, in a period from one second to three seconds, the bonding surface 24 is maintained at a predetermined temperature (S13). In this period, the semiconductor die 102 is joined to the substrate 101. Next, in a period after three seconds, the semiconductor die 102 is separated from the bonding tool 12 (S14) and the heating is stopped. That is, in a period after three seconds, the semiconductor die 102 is not held by the bonding surface 24. In addition, since the heating is stopped, the temperature of the bonding surface 24 gradually decreases. Then, the bonding tool 12 executes a step (S12) of holding the next semiconductor die 102.

Here, the semiconductor die 102 is transported to the intermediate stage 3 by a transport mechanism not illustrated, with the thermo-compression film 103 stuck to the first main surface 102a of the semiconductor die 102. The semiconductor die 102 is joined to the substrate 101 and then suctioned to be held by the bonding tool 12 which is not sufficiently cooled.

Therefore, when the bonding surface 24 is brought into contact with the semiconductor die 102 in order to hold the semiconductor die 102 by the bonding tool 12, the heat of the bonding tool 12 is transferred to the thermo-compression film 103 via the semiconductor die 102. This heat transfer increases tackiness of the thermo-compression film 103. Hence, the thermo-compression film 103 sticks to the base 31. As a result, it is difficult for the thermo-compression film 103 to peel from the base 31. Hence, in order to hold the semiconductor die 102 with the thermo-compression film 103 stuck thereto, the temperature of the bonding tool 12 is considered to be lowered to the extent that the temperature does not influence the tackiness of the thermo-compression film 103. For example, when the heater 18 stops the heating, the bonding tool 12 is cooled naturally. Therefore, between step S14 and step S12, a cooling period of the bonding tool 12 is considered to be arranged. However, this cooling period prolongs the time required for the bonding work.

In order to shorten the time required for the bonding work, the bonding tool 12 may be capable of holding the semiconductor die 102 even when the bonding tool 102 has a high temperature. For example, regarding the tackiness of the thermo-compression film 103, a temperature condition for holding the semiconductor die 102 turns out 50 degrees Celsius. Consequently, according to the graph G1, it is necessary to stand-by for at least three seconds after the heating is stopped. On the other hand, when the temperature condition is 100 degrees Celsius which is higher than 50 degrees Celsius, stand-by may be performed by one second after the heating is stopped. That is, the stand-by time is shortened by two seconds.

Part (b) of FIG. 8 illustrates an example of a relationship between a distance from the bonding surface 24 to the semiconductor die 102 and the temperature of the semiconductor die 102. The temperature of the bonding surface 24 is set to 200° C. As will be understood from a graph G2, when the distance from the bonding surface 24 to the semiconductor die 102 is zero (that is, contact state), the temperature of the semiconductor die 102 is equal to the temperature (200° C.) of the bonding surface 24. On the other hand, when the distance from the bonding surface 24 to the semiconductor die 102 is 1 mm or longer, the temperature of the semiconductor die 102 is lowered to 50° C. or below. That is, by controlling a height (that is, the gap D) by which the push-up mechanism 33 pushes up the semiconductor die 102, it is possible to control the temperature of the semiconductor die 102 and the thermo-compression film 103 when the bonding surface 24 is brought close to the semiconductor die 102.

Hence, in a configuration in which the distance between the bonding surface 24 and the semiconductor die 102 is 1 mm or longer, a problem of sticking due to improvement in tackiness does not arise, as long as the semiconductor die 102 is separated from the intermediate stage 3. Consequently, in a configuration in which the semiconductor die 102 is lifted by 1 mm or higher, the semiconductor die 102 can be held by the bonding tool 12 even when the temperature of the bonding surface 24 is 200° C.

Moreover, the graph G1 illustrated in part (a) of FIG. 8 and the graph G2 illustrated in part (b) of FIG. 8 are examples. The bonding apparatus 1 according to the embodiment is not limited to the graphs G1 and G2 and the above-described numerical values.

Second Embodiment

Figure 9:
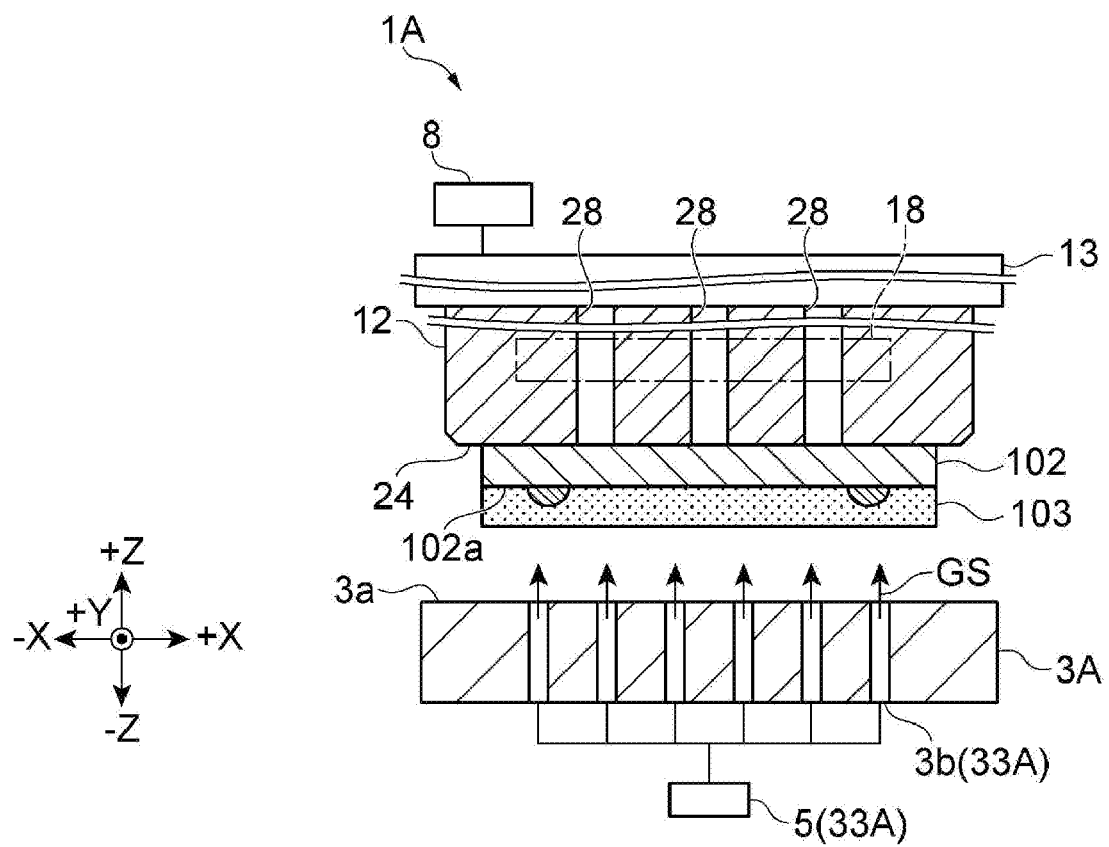
FIG. 9 is a cross-sectional view illustrating a bonding tool and an intermediate stage according to a second embodiment.

As illustrated in FIG. 9, a bonding apparatus 1A according to the second embodiment is used for delivering the semiconductor die 102 in which the thermo-compression film 103 is arranged on a first main surface thereof, for example. The bonding apparatus 1A includes an intermediate stage 3A. The intermediate stage 3A includes a push-up unit 33A. The push-up mechanism 33 of the first embodiment is a mechanism that comes into direct contact with the semiconductor die 102 and physically pushes up the semiconductor die 102. The push-up unit 33A of the second embodiment pushes up the semiconductor die 102 by blowing gas GS (gaseous matter) to the semiconductor die 102 without coming into direct contact with the semiconductor die 102.

Specifically, the intermediate stage 3A has a plurality of gas holes 3b (blowing holes) which are open at the die placing surface 3a. A compressor 5 which supplies compressed air which is the gas GS is connected at the other end side of the gas hole 3b. The compressor 5 supplies the compressed air having a predetermined pressure and flow speed to the gas holes 3b, based on a control signal which is supplied from the controller 8. The compressed air hits the thermo-compression film 103 arranged on the semiconductor die 102, and pushes up the semiconductor die 102 toward the bonding surface 24. When the semiconductor die 102 comes into contact with the bonding surface 24, the controller 8 starts a sucking operation of the bonding tool 12, and the semiconductor die 102 is held by the bonding surface 24.

In this case, since the thermo-compression film 103 is arranged on the semiconductor die 102, heat of the bonding tool 12 is transferred to the thermo-compression film 103. However, in a state that the heat is transferred, the thermo-compression film 103 is already separated from the intermediate stage 3A. Hence, sticking of the thermo-compression film 103 to the intermediate stage 3A is suppressed, the thermo-compression film 103 having increased tackiness due to an influence of the heat.

As described above, the present invention is described in detail based on the embodiments. However, the present invention is not limited to the above-described embodiments. The present invention can be modified in various manners without departing from the gist of the invention.

For example, in a case of coming into direct contact with the semiconductor die 102 so as to push up the semiconductor die, the press-up member is not limited to the frame-shaped press-up member. For example, the press-up member may be four press-up bars which are brought into contact with four corners of the semiconductor die 102, respectively.

REFERENCE SIGNS LIST 1, 1A bonding apparatus
2 wafer stage
2a mounting surface
3, 3A intermediate stage (stage)
3a die placing surface
3b gas hole
4 bonding stage
4a mounting surface
5 compressor
6 bonding unit
7 XY stage
8 controller
8a operation unit
8b display unit
9 imaging unit
11 bonding head
12 bonding tool
13 Z-axis drive mechanism
14 imaging unit
16 bonding distal end portion
18 heater
24 bonding surface
28 suction hole
31 base
33 push-up mechanism
33A push-up unit
34 push-up frame
34b contact surface
34a base disposing portion
36 drive unit
100 semiconductor device (electronic component)
101 substrate
101a first main surface
101b second main surface
102 semiconductor die
102a first main surface
102b second main surface
103 thermo-compression film
104 electrode pad
106 bump electrode (electrode portion)
107 electrode pad
108 protective film
110 wafer
110a first main surface
110b second main surface

What is claimed is:

1. A bonding apparatus, bonding an electronic component, which has an electrode surface provided with a plurality of electrode portions, to a substrate or another electronic component by thermo-compression, with a thermo-compression film attached to the electrode surface being interposed therebetween, the bonding apparatus comprising:
    a stage that has a placing surface on which the electronic component is placed, with the thermo-compression film being interposed therebetween; and
    a bonding tool which detachably holds a main surface of the electronic component that is placed on the stage, the main surface being on a reverse side of the electrode surface,
    wherein the stage has a push-up unit which applies, to the electrode surface of the electronic component, a force for separating the electronic component therefrom in a normal direction of the placing surface.

2. The bonding apparatus according to claim 1, wherein the push-up unit has a press-up member comprising a contact portion that is brought into contact with the electrode surface, and the press-up member reciprocates in the normal direction such that a first position at which the contact portion is not in contact with the electrode surface placed on the placing surface and a second position at which the contact portion is brought into contact with the electrode surface and the electronic component is separated from the placing surface in the normal direction are switched to each other.

3. The bonding apparatus according to claim 1, wherein the push-up unit has a blowing portion from which gaseous matter is blown to the electrode surface.

4. A bonding method for bonding an electronic component using a bonding apparatus, the bonding apparatus bonding the electronic component, which has an electrode surface provided with a plurality of electrode portions, to a substrate or another electronic component by thermo-compression, with a thermo-compression film attached to the electrode surface being interposed therebetween, the bonding apparatus comprising:
    a stage that has a placing surface on which the electronic component is placed, with the thermo-compression film being interposed therebetween; and
    a bonding tool which detachably holds a main surface of the electronic component that is placed on the stage, the main surface being on a reverse side of the electrode surface,
    wherein the stage has a push-up unit which applies, to the electrode surface of the electronic component, a force for separating the electronic component therefrom in a normal direction of the placing surface, the bonding method comprising:
    a step of placing the electronic component on the stage that has the placing surface on which the electronic component is placed, with the thermo-compression film being interposed therebetween; and a step of holding the electronic component by using the bonding tool which detachably holds the main surface of the electronic component that is placed on the stage, the main surface being on the reverse side of the electrode surface, wherein the step of holding the electronic component includes a step of separating the electronic component from the stage by applying the force to the electrode surface in the normal direction of the placing surface, and a step of holding, by the bonding tool, the electronic component separated from the stage.

* * * * *